United States Patent
Pitschi et al.

(10) Patent No.: US 9,019,038 B2
(45) Date of Patent: Apr. 28, 2015

(54) ELECTRICAL COMPONENT

(75) Inventors: Maximilian Pitschi, Rottach-Egern (DE); Juergen Kiwitt, Munich (DE); Andreas Fleckenstein, Ulm (DE)

(73) Assignee: Epcos AG, Munich (DE)

( * ) Notice: Subject to any disclaimer, the term of this patent is extended or adjusted under 35 U.S.C. 154(b) by 0 days.

(21) Appl. No.: 12/731,039

(22) Filed: Mar. 24, 2010

(65) Prior Publication Data

US 2010/0207704 A1   Aug. 19, 2010

Related U.S. Application Data

(63) Continuation of application No. PCT/EP2008/062971, filed on Sep. 26, 2008.

(30) Foreign Application Priority Data

Sep. 28, 2007  (DE) .......... 10 2007 046 728

(51) Int. Cl.
| | |
|---|---|
| H03H 9/72 | (2006.01) |
| H03H 7/46 | (2006.01) |
| H01P 1/213 | (2006.01) |
| H03H 9/00 | (2006.01) |
| H03H 9/70 | (2006.01) |

(52) U.S. Cl.
CPC .......... H03H 9/0023 (2013.01); H03H 7/463 (2013.01); H01P 1/213 (2013.01); H03H 9/725 (2013.01); H03H 9/70 (2013.01)

(58) Field of Classification Search
CPC ........ H03H 7/461; H03H 7/46; H03H 7/463; H03H 9/70; H03H 9/706; H03H 9/725; H03H 9/76; H03H 7/482; H01P 1/213

USPC .............. 333/1, 4, 5, 126–129, 132, 134, 333/165–167, 175, 176, 185, 202–205
See application file for complete search history.

(56) References Cited

U.S. PATENT DOCUMENTS

| | | | |
|---|---|---|---|
| 6,351,194 B2 | 2/2002 | Takahashi et al. | |
| 6,489,860 B1 * | 12/2002 | Ohashi | 333/133 |
| 6,822,534 B2 * | 11/2004 | Uriu et al. | 333/185 |
| 7,038,551 B2 | 5/2006 | Kearns | |
| 2002/0000895 A1 | 1/2002 | Takahashi et al. | |
| 2002/0008598 A1 * | 1/2002 | Huang et al. | 333/33 |
| 2002/0084868 A1 * | 7/2002 | Nagata et al. | 333/101 |
| 2003/0090338 A1 | 5/2003 | Muramatsu | |
| 2003/0098757 A1 | 5/2003 | Iwamoto et al. | |
| 2003/0214369 A1 | 11/2003 | Kearns | |

(Continued)

FOREIGN PATENT DOCUMENTS

| | | |
|---|---|---|
| DE | 10 2005 056 340 A1 | 5/2007 |
| EP | 1 365 509 A1 | 11/2003 |

(Continued)

*Primary Examiner* — Robert Pascal
*Assistant Examiner* — Gerald Stevens
(74) *Attorney, Agent, or Firm* — Slater & Matsil, L.L.P.

(57) ABSTRACT

An electrical component, e.g., a diplexer or a duplexer, can have one of a number of diverse arrangements for terminal surfaces on the substrate bottom. For example, the terminal surfaces for first and second filters are not disposed at the maximum distance from one another. First and second filters can be disposed as one or two discrete components on the substrate, wherein one filter can be implemented as being integrated in a multilayer substrate.

31 Claims, 6 Drawing Sheets

(56) References Cited

U.S. PATENT DOCUMENTS

| | | |
|---|---|---|
| 2007/0018754 A1* | 1/2007 | Okuyama ................... 333/126 |
| 2007/0030094 A1* | 2/2007 | Omote ......................... 333/133 |
| 2007/0222540 A1* | 9/2007 | Nishigaki et al. ............ 333/133 |
| 2008/0290965 A1 | 11/2008 | Pitschi et al. |

FOREIGN PATENT DOCUMENTS

| | | |
|---|---|---|
| JP | 2003-163570 | 6/2003 |
| JP | 2003-198325 | 7/2003 |
| JP | 2003-347964 | 12/2003 |
| WO | WO-2007/059735 A2 | 5/2007 |

* cited by examiner

ELECTRICAL COMPONENT

This application is a continuation of co-pending International Application No. PCT/EP2008/062971, filed Sep. 26, 2008, which designated the United States and was not published in English, and which claims priority to German Application No. 10 2007 046 728.3 filed Sep. 28, 2007, both of which applications are incorporated herein by reference.

TECHNICAL FIELD

The invention relates to an electrical component comprising a first and a second filter, for example, a diplexer or a duplexer, implemented in or mounted on a common substrate.

BACKGROUND

A duplexer, including an advantageous footprint, is known, for example, from WO 2007/059735 A.

SUMMARY

In one aspect, the present invention discloses an improved pinning or footprint for a component, by means of which further miniaturization of the component is possible without degrading the electrical performance of the component.

In one embodiment, an electrical component is specified, which includes a first and a second filter implemented or mounted on a common substrate. The substrate has a common signal connection on the bottom side, to which both filters are connected in parallel. A first and a second filter connection for the first and second filter is also provided on the bottom side. Every signal or filter connection on the bottom side is characterized in that an individual terminal surface conducting a signal, or alternatively a pair of terminal surfaces balanced to each other with respect to ground is assigned to it, the terminal surfaces implementing the respective connection to the filter or the component. A plurality of ground terminal surfaces is also disposed on the bottom side. At least one of the ground terminal surfaces is disposed in a corner, and is further away from a terminal surface of the signal connection than a terminal surface of the filter connections. In other words, the distance between a terminal surface of the signal connection and a terminal surface of a filter connection is less than the distance between a ground terminal surface in the corner and a terminal surface of the signal connection. Altogether, the footprint includes at least seven terminal surfaces disposed near the edges of the substrate, which is, for example, rectangular, the terminal surfaces being associated with one of the types of terminal surfaces named above.

Three different connections, each having at least one terminal surface assigned to the connection, are provided in the electrical component, while the remainder of the terminal surfaces that are present are ground terminal surfaces. In the component at least one ground terminal surface exists that includes a maximum distance to a signal terminal surface, wherein the distance is greater than or equal to the maximum distance between a signal connection and an arbitrary filter connection. This means that not all filter connections include the maximum distance to the signal connection.

In one embodiment, the component includes terminal surfaces in an arrangement corresponding to a grid of at least 3×3 on the bottom side of the substrate. To this end, the terminal surfaces can be disposed in rows and/or columns. The arrangement is not, however, required to be symmetrical. Individual columns and/or rows can be present that have a greater number of terminal surfaces than the other rows and/or columns. The terminal surfaces can, in particular also have different sizes. It is advantageous, but not required, if the ground terminal surfaces include a greater area than the signal and/or filter terminal surfaces.

In one embodiment, the component includes a pair of electrical terminal surfaces balanced to each other with respect to ground, wherein the two terminal surfaces of the pair are disposed directly adjacent to each other. The component can also include two or three pairs of terminal surfaces balanced to each other with respect to ground, wherein the terminal surfaces of each pair are disposed directly adjacent to each other.

It is advantageous if all signal and filter terminal surfaces are disposed in an edge area on the bottom side of the substrate. At least one ground terminal surface can then be present in a center area. Here, a terminal surface is considered to be disposed in the edge area if it is disposed in one of the rows and/or columns pointing outwards, of an array of terminal surfaces that is at least 3×3 in size. Following the outer perimeter of the substrate, that is, between the signal and each of the filter connections, and between the first and second filter connection at least one ground terminal surface is provided in the edge area. In the center area, which is enclosed by the edge area and the terminal surfaces disposed there, at least one centrally disposed ground terminal surface is provided.

The surface area of at least one ground terminal surface preferably exceeds that of the signal or filter terminal surfaces, so that an improved ground connection is provided solely by the greater metallization.

A smaller area of a filter connection leads to a lower capacitance associated with the area, so that the terminal surface can incur only a lower capacitive coupling.

According to one variant, the at least one terminal surface of the signal connection is disposed in the center of one of the substrate edges. The row of terminal surfaces in which the signal connection is disposed then includes at least two ground terminal surfaces on both sides of the signal connection, and thus, includes a total of at least three terminal surfaces.

The component is preferably formed as a diplexer or duplexer. In this case, the signal connection is connected to an antenna connection, or itself implements the antenna connection. The two filter connections are accordingly formed as filter input and/or filter output.

In order to improve the ground connection, each ground connection or each ground terminal surface can be connected to one of the two filters, or to both filters, by a plurality of vias. The inductivity of the ground connections is thus also minimized. The terminal surfaces of the signal and filter connections, in contrast, are advantageously connected to the corresponding filter by only exactly one via each.

According to one variant embodiment, at least one of the filter connections includes a pair of terminal surfaces balanced to each other with respect to ground, and disposed at different distances from the signal connection. The terminal surface of the pair that is disposed closer to the signal connection includes a smaller surface area than the other terminal surface of the pair. This has the effect that the capacitive coupling between the different terminal surfaces, which tends to be greater at shorter distances, is again reduced by the smaller area. In this manner, both terminal surfaces of the connection pair can be formed having approximately equal coupling to the signal connection or the signal terminal surface.

In order to improve the ground, it is further proposed that at least two of the ground terminal surfaces are electrically conductively connected to each other directly on the bottom side of the substrate. This can be done by means of conductors applied to the bottom side. In this manner, the ground is "enlarged" and any possible difference in the quality of ground connections is leveled by the electrical connection and thus compensated for.

The connections of the component are connected, as mentioned, to the corresponding filters by means of vias passing through the substrate. For each filter connection, the via connected to the filter connection is routed directly adjacent to a via connected to a ground connection of the same filter, wherein the distance of the via leading to the filter connection is greater than the distance of the via to other vias. In this manner, the current loop formed by the signal via and the ground via includes a minimal cross-sectional area, and thus a minimal inductive coupling is generated.

In the center area, as mentioned, at least one ground terminal surface can be provided, whose area is greater than the areas of the other terminal surfaces. In this manner, an improved shielding is provided between the terminal surfaces of different filter and signal connections disposed in the edge area.

Good decoupling between the first and second filters or the filter terminal surfaces thereof is achieved if the corresponding filter connections for different filters are disposed at opposite edges of the substrate. The at least one terminal surface for the signal connection is then disposed on the third edge of the substrate.

The component can include one, two, or three connections that are balanced to each other with respect to ground. As the number of connections balanced to ground increases, the number of terminal surfaces required for the same also increases. A component having one connection that is balanced to ground requires at least seven terminal surfaces disposed in the edge area, or, assuming that an additional ground terminal surface is provided opposite the terminal surface for the signal connection, then actually, eight.

A component having two connections that are balanced to ground requires at least eight terminal surfaces disposed in the edge area, while a component having three connections that are balanced to ground requires at least nine such terminal surfaces. In addition, there is the at least one additional ground terminal surface that is advantageously present and disposed in the center area, so that a corresponding total number of terminal surfaces results. It is advantageous if at least those terminal surfaces disposed in the edge area are symmetrical to each other with regard to their arrangement or grid, wherein at least one plane of symmetry is advantageously given. Terminal surfaces disposed in the edge area are disposed in rows and/or columns of at least three, but preferably a maximum of four terminal surfaces.

BRIEF DESCRIPTION OF THE DRAWINGS

In the following, the invention is explained in more detail using example embodiments and the associated figures. The figures are purely schematic and are not true to scale, so that neither absolute nor relative dimensions should be taken from them.

The following list of reference symbols can be used in conjunction with the drawings:
FS Filter substrate
F1 First filter
F2 Second filter
SU Substrate
SA Signal terminal surface
FA Filter terminal surface
MA Ground terminal surface
FS Common filter substrate
V Via

DETAILED DESCRIPTION OF ILLUSTRATED EMBODIMENTS

Figure 1A:
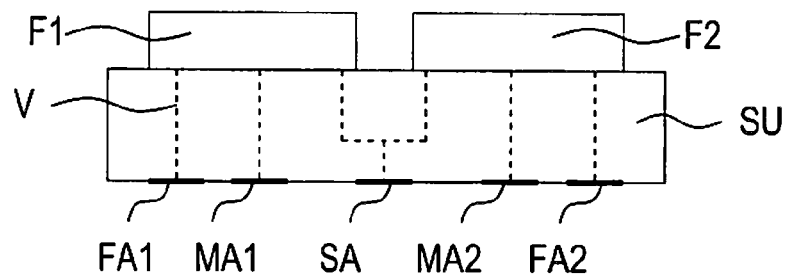
FIGS. 1A through 1C show three different embodiments of a component in schematic cross section.

The electrical component is characterized by a common substrate SU, which has the indicated terminal surfaces on its bottom side. The first and second filter F1, F2 can be disposed, as shown in FIG. 1A, as separate discrete components on the surface of the substrate SU, and electrically conductively connected to the same. The substrate SU includes at least one dielectric layer, which has terminal surfaces on the bottom side and contact surfaces for the filter or filters on the top side. The top and bottom sides are electrically conductively connected by connections, and in particular by the denoted vias V (shown as dashed lines in FIG. 1) which are routed in the interior of the substrate. The substrate is advantageously formed having multiple layers, wherein a metallization plane having a structured metallization that can implement a circuit, is disposed between every two dielectric layers. The substrate can be made of a circuit board material, polymer, or ceramic, and is advantageously formed from a low-distortion LTCC ceramic (low temperature cofired ceramic) or of an HTCC (high temperature cofired ceramic).

Figure 1B:
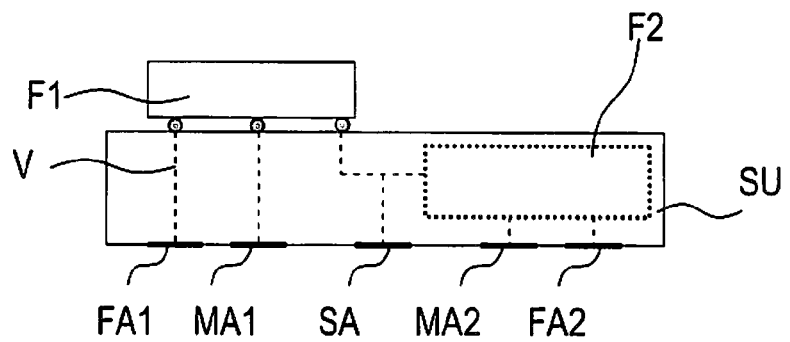

The multilayer design of the substrate SU also allows the integration of passive component functions in the substrate by corresponding structuring of the metal surfaces and conductors in the metallization planes. It is thus possible that the multilayer substrate has capacitances and inductances in addition to resistors. The passive components can also be connected in a suitable manner such that the interconnection can be used to implement additional circuits having component functions. It is possible, for example, to implement simple filter circuits using integrated LC elements (inductors and capacitors). Thus one of the two filters (F2) can include LC components as shown in FIG. 1B, or be made exclusively of such components, which are integrated in the substrate SU. The other filter F1 is then preferably implemented as a discrete filter component mounted on the surface of the substrate. FIG. 1B shows such an arrangement having a second filter F2 integrated in the substrate, and a first filter F1 mounted on the substrate.

Figure 1C:
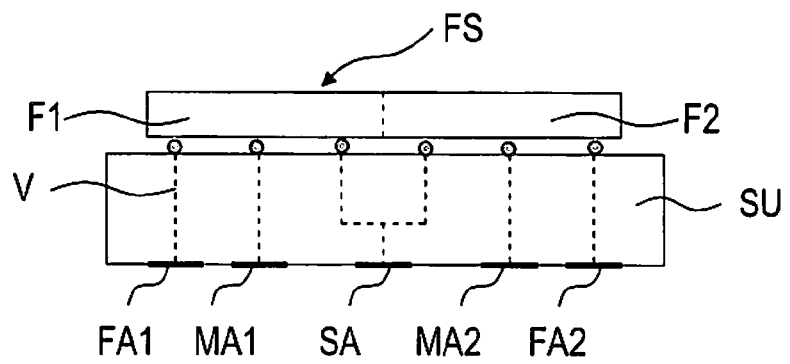

It is also possible to form the two filters on a common piezoelectrical filter substrate FS, which is mounted on the surface of the substrate SU, as shown in FIG. 1C.

For all illustrated embodiments, the vias that connect the filters and the terminal surfaces to each other are preferably routed through the substrate SU in a straight line. It is, however, also possible that the connection between the filter and the terminal surfaces is made by at least two partial vias, each penetrating through only a part of the layers of the multilayer substrate, and connected to each other by means of a transverse segment disposed within a metallization plane. The partial vias can, therefore, be laterally relative offset to each other.

Figure 2A:
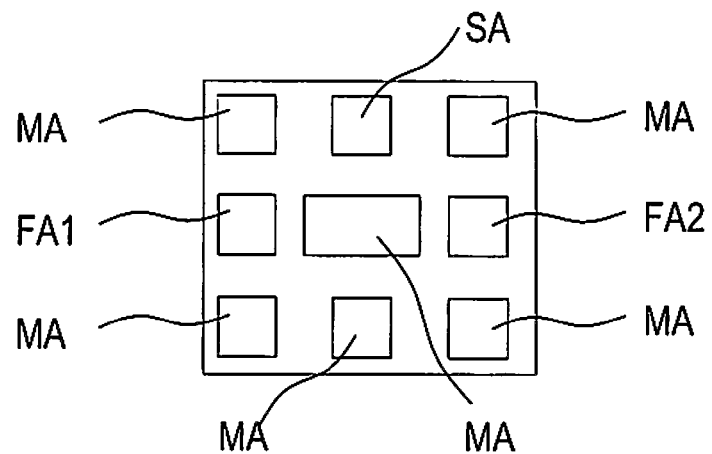
FIGS. 2A through 2C show terminal surfaces for a component having connections that are exclusively unbalanced with respect to ground.
Figure 2B:
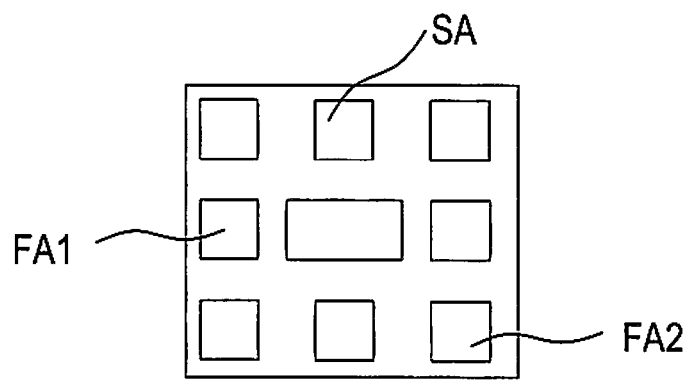
Figure 2C:
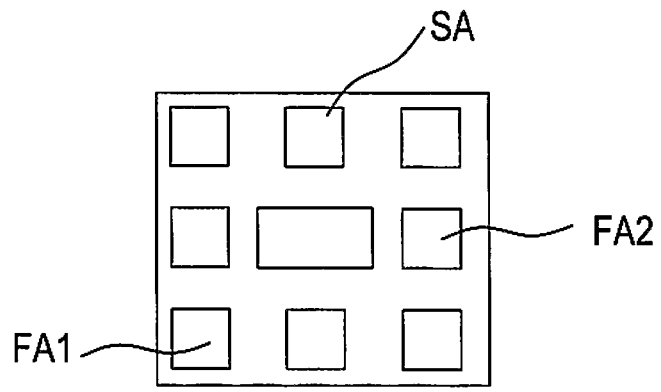

FIGS. 2A-2C shows a top view of the terminal surfaces on the substrate bottom for a component having exclusively connections that are unbalanced to ground. In all embodiments in FIGS. 2A-2C, arrangements of 3×3 terminal surfaces are shown. It is also possible, however, to provide a greater number of terminal surfaces, which, however, comes at the expense of the size of the terminal surfaces and/or the area required on the bottom side.

In the embodiment according to FIG. 2A, the terminal surface SA assigned to the signal connection is disposed in the center of the substrate edge shown at the top of the illustration. The first and second filters each have a filter connection FA1, FA2, disposed on opposite sides of the substrate bottom and preferably centered there. All terminal surfaces disposed in the center are adjacent to ground terminal surfaces on both sides along the edges. In addition, as shown, a ground terminal surface MA can also be disposed in the center area, that is, not adjacent to the edge.

FIG. 2B shows an alternative arrangement, in which each terminal surface FA1, FA2 for the first and second filters is disposed on opposite edges of the substrate bottom, wherein the first filter connection FA1 is centered, and the second filter connection FA2, in contrast, is disposed in the lower right corner. The terminal surface SA assigned to the signal connection is disposed on a third edge, and centered there. At the positions missing from the 3×3 grid, ground terminal surfaces MA are provided, which are no longer specially designated as such in FIGS. 2B and 2C. Even though all terminal surfaces disposed in the edge area are shown here having the same size, they can, however, deviate therefrom. In particular, it is possible that the terminal surface for the first filter disposed closer to the signal connection SA has a smaller surface area than the terminal surface FA2 of the second filter F2, disposed further away from the signal terminal surface SA.

In the arrangement according to FIG. 2C, the positions for the terminal surfaces of the first and second filters are exchanged, and the arrangement is a mirror image.

Figure 3A:
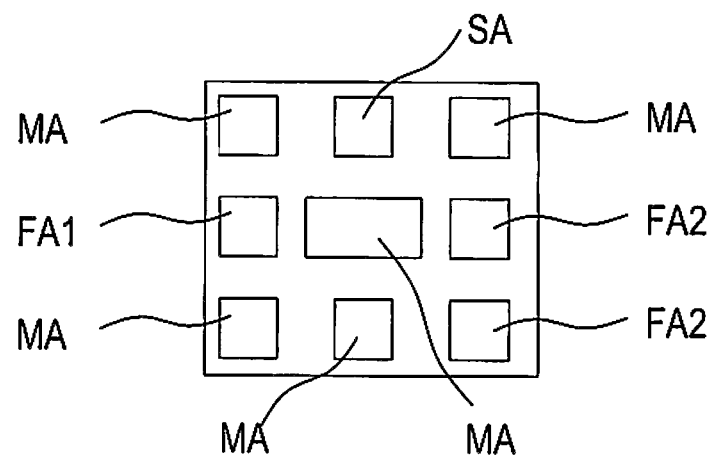
FIGS. 3A through 3C show arrangements of the terminal surfaces for a component having a connection that is balanced to ground.
Figure 3B:
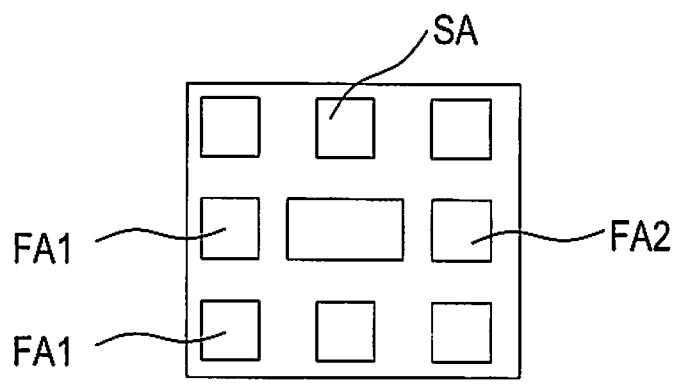
Figure 3C:
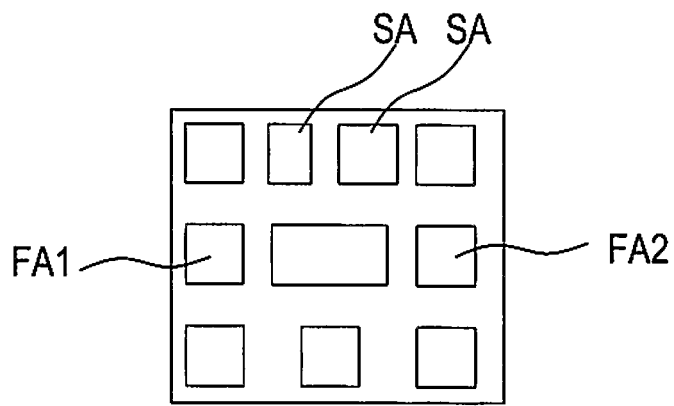

FIGS. 3A-3C shows the arrangement of terminal surfaces for a component having exactly one connection that is balanced to ground. The one connection balanced to ground can be assigned to the first filter F1, the second filter F2, or the signal connection, and includes two terminal surfaces accordingly. Both terminal surfaces of the connection balanced to ground are preferably formed directly adjacent to each other and of equal size. It is also possible, however, that different terminal surfaces of the same connection (balanced to ground) have different surface areas.

FIG. 3A shows an arrangement having a connection FA1 that is not balanced to ground for a first filter F1, disposed at the center of a substrate edge, and a connection FA2 balanced to ground for the second filter F2 at an opposite edge of the substrate. The terminal surface for the signal connection SA is disposed at the center of the third edge. FIG. 3B shows a variant wherein the connection that is balanced to ground is assigned to the first filter.

The arrangements shown in FIGS. 3A and 3B are based on a 3×3 grid. In FIG. 3C, in contrast, the signal connection is formed to be balanced to ground, and, therefore, includes two terminal surfaces SA disposed at the center of an edge. Filter connections FA1 and FA2 are disposed opposite each other at second and third edges, preferably centered, and enclosed on both sides by ground terminal surfaces MA. A single ground terminal surface or two ground terminal surfaces (not shown) for reasons of symmetry, can be provided at the edge opposite the signal terminal surfaces SA. Because the ground terminal surfaces can be connected to each other, it is possible in general in all embodiments to combine smaller, directly adjacent ground terminal surfaces into one larger ground terminal surface.

Figure 4A:
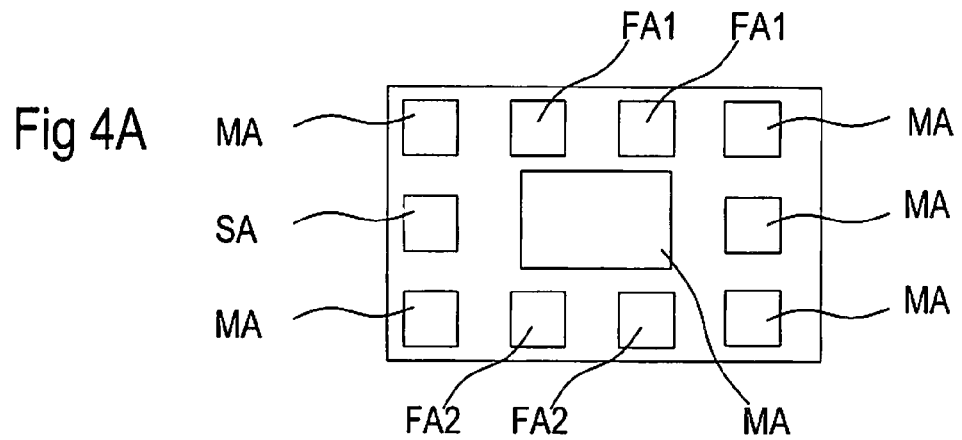
FIGS. 4A through 4F show arrangements of the terminal surfaces for a component having two connections that are balanced to ground.

FIGS. 4A-4F shows the arrangement of the terminal surfaces on the substrate bottom for components having two connections balanced to ground. In FIG. 4A, the first and second filter connections FA1 and FA2 are each formed to be balanced to ground, and disposed at opposite substrate edges so that both terminal surfaces balanced to ground are directly adjacent to each other. The signal connection that is not balanced to ground is provided at the center of a third edge. Because the first and second filter connections FA1, FA2 are each adjacent to a ground terminal surface on both sides along a substrate edge, the number of terminal surfaces disposed adjacent to each other along the edge is four, which applies to both opposite sides. The substrate edge having the signal connection SA includes only three terminal surfaces disposed parallel thereto, as does the opposite substrate edge.

Figure 4B:
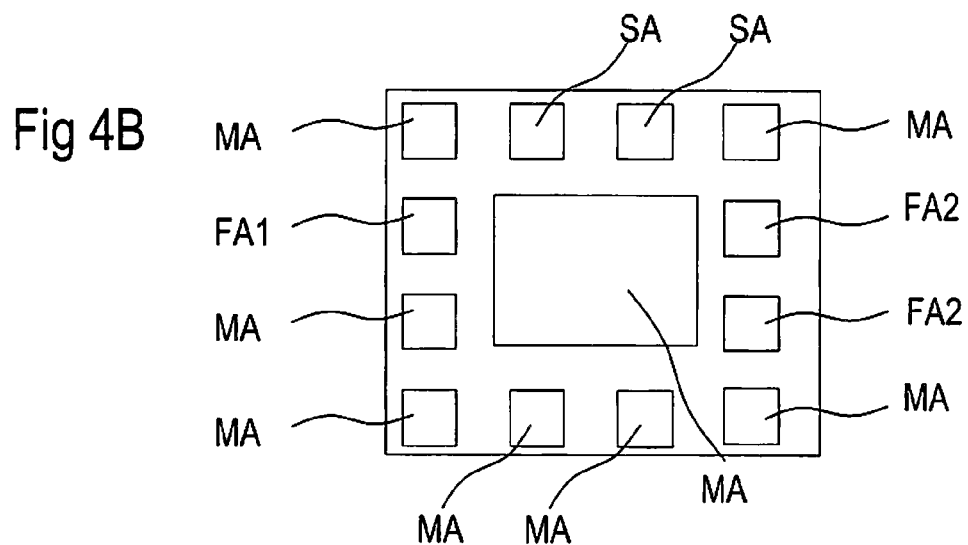
Figure 4C:
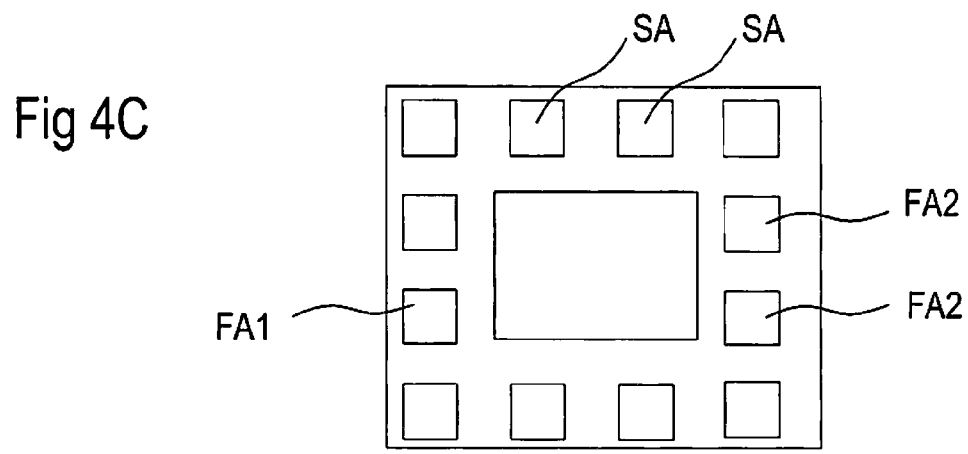

In FIG. 4B, the signal connection SA and the second filter connection FA2 are formed to be balanced to ground, and the first filter connection FA1, in contrast, is not balanced to ground. The same applies to the arrangement according to FIG. 4C. FIG. 4B and FIG. 4C differ from each other only in that in FIG. 4C, the filter connection FA1 not balanced to ground is further away from the signal connection SA than in FIG. 4B. This is achieved in that the first filter connection FA1 is disposed at the second or third position in a column including four terminal surfaces.

Figure 4D:
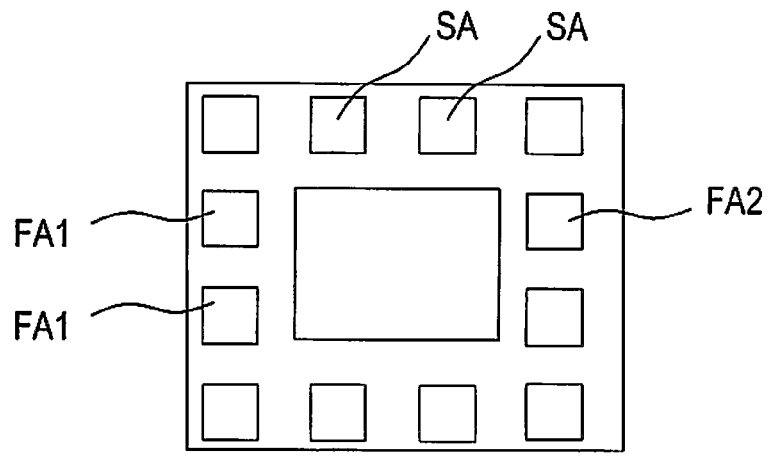
Figure 4E:
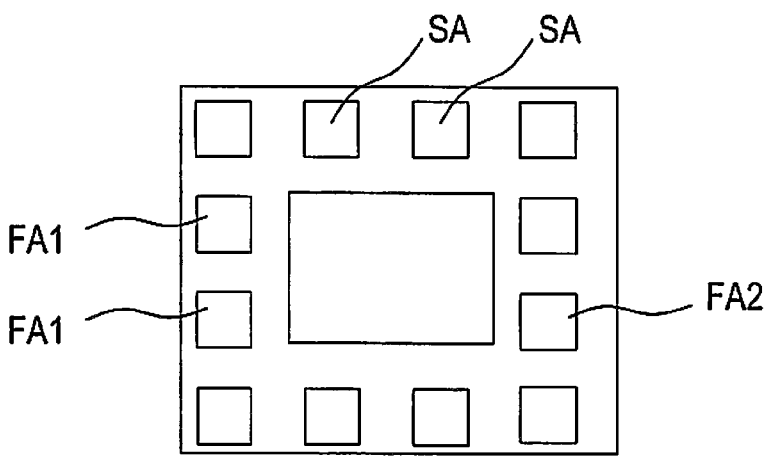

In FIGS. 4D and 4E, the signal connection SA and the first filter connection FA1 are designed to be balanced to ground, and the second filter connection FA2, in contrast, is not balanced to ground. Similar to the pair of possible arrangements according to FIGS. 4B and 4C, the arrangements according to FIGS. 4D and 4E differ in the position of the second filter connection FA2 that is not balanced to ground, which is further away form the signal connection SA in FIG. 4E than in FIG. 4D.

Figure 4F:
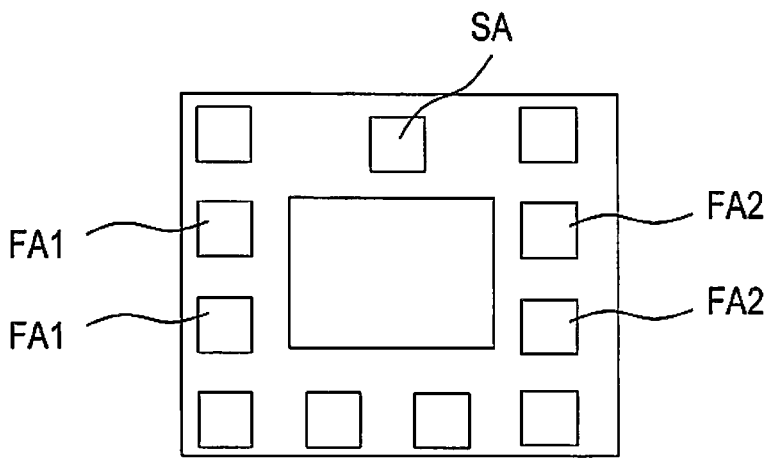

FIG. 4F shows a further possibility, wherein the first and second filter connections FA1, FA2 are formed to be balanced to ground, and the signal connection SA, in contrast, is not balanced to ground. All connection types are disposed centered along a substrate edge, wherein the first and second filter connections are disposed at opposite substrate edges, and the terminal surface for the signal connection SA is disposed at a third substrate edge. Although, as previously mentioned, symmetry of the terminal surfaces is not absolutely required, nevertheless a lower number of terminal surfaces is shown for symmetry reasons in FIG. 4F than in the other embodiments. All embodiments shown in FIG. 4 are characterized by a ground terminal surface MA disposed centrally in the center area of a substrate bottom, which can include two to four grid positions of a 3×4 or 4×4 grid.

Figure 5A:
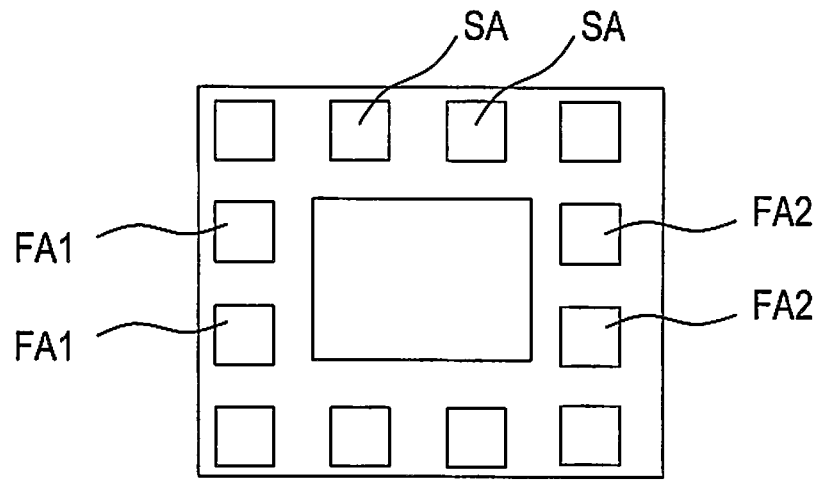
FIGS. 5A through 5C show arrangements of the terminal surfaces for a component having three connections that are balanced to ground.
Figure 5B:
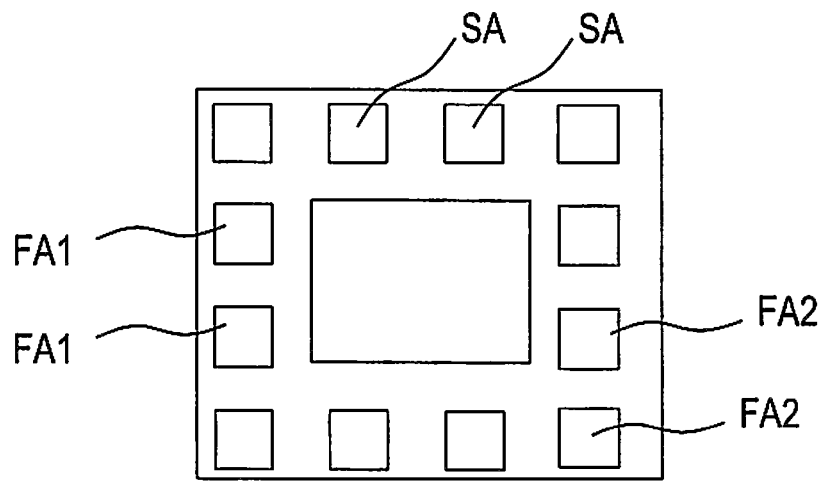
Figure 5C:
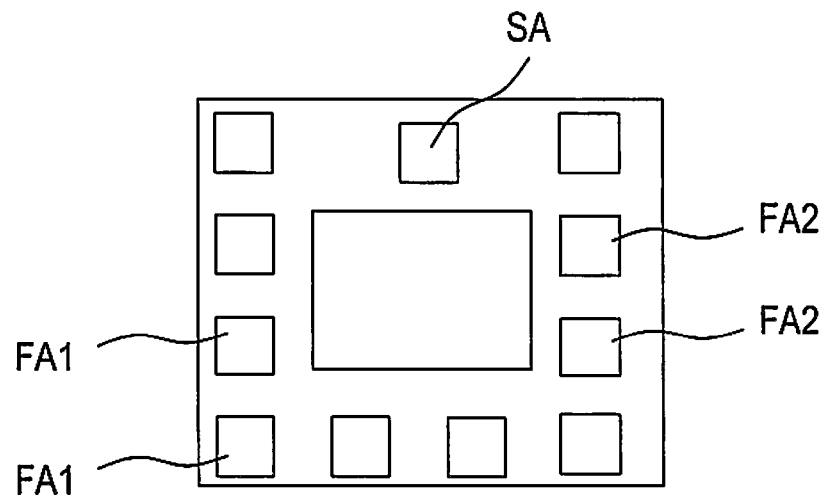

FIGS. 5A-5C shows three different embodiments for components having three connections balanced to ground. In FIG. 5A, the first and second filter connections FA1, FA2 are disposed opposite each other, and each centered on a substrate edge. The signal connection SA is also disposed in the center of the third substrate edge. In FIG. 5B, the two terminal surfaces of the second filter connection FA2 are further away from the signal connection SA than the terminal surfaces of the first filter connection FA1. In the arrangement according to FIG. 5C, the terminal surfaces of the first filter connection FA1 are further away from the signal connection SA than those of the second filter connection FA2. In the embodiments according to FIGS. 5B and 5C, in each case one filter connection is disposed in a corner of the substrate bottom, while in all embodiments according to FIGS. 4 and 5A all corners of the substrate bottom are occupied by ground terminal surfaces.

The invention is not limited to the arrangements of terminal surfaces shown in the embodiments. Rather, in nearly all embodiments, a greater or lesser number of terminal surfaces can be provided, and a plurality of terminal surface sizes can be provided, so that at least two terminal surfaces of different sizes are implemented for the first and second filter connections and/or for the signal connection in one component. The advantage of large ground terminal surfaces has already been explained, so that the advantage can be accommodated by corresponding enlarged ground terminal surfaces.

Components including a terminal surface arrangement according to the invention can be optimized for maximum selection and insulation. Here, insulation levels of greater than 50 dB can thereby be achieved, because the electromagnetic crosstalk along and between the signal paths can be minimized. The proposed arrangement deviates for the first time from rigid, specifically prescribed arrangements of terminal surfaces on the substrate bottom, because their size, number, and arrangement has been considered for the first time in the component design for minimizing crosstalk.

Using the components according to the invention, component sizes smaller than 3.5 mm×3.5 mm, or correspondingly small component areas, can be achieved in a rectangular embodiment. Contrary to an optimization goal for known terminal surface arrangements, the connections for the first and second filter connections are not at a maximum distance from each other, but nevertheless are well insulated from each other, so that the component achieves a high selection and good insulation.

What is claimed is:

1. An electrical component comprising:
    a substrate having a rectangular bottom surface;
    a first filter implemented in or mounted on the substrate;
    a second filter implemented in or mounted on the substrate;
    a common signal connection, both the first and second filters being connected in parallel to the common signal connection;
    a first filter connection at the first filter;
    a second filter connection at the second filter, wherein the common signal connection and the first and second filter connections are disposed on the bottom surface of the substrate and are each assigned an individual terminal surface carrying a signal, or a pair of terminal surfaces balanced to each other with respect to ground, thereby implementing respective component connections; and
    a plurality of ground terminal surfaces disposed on the bottom surface of the substrate;
    wherein altogether at least seven terminal surfaces are disposed near edges of the substrate with a small space between the at least seven terminal surfaces and the edges of the substrate, the at least seven terminal surfaces including the plurality of ground terminal surfaces and the individual terminal surfaces or the pairs of terminal surfaces;
    wherein at least one of the plurality of ground terminal surfaces is disposed in a corner of the substrate bottom and is further away from at least one of the terminal surfaces of the common signal connection than one of the terminal surfaces of the first and second filter connections;
    wherein each ground terminal surface is connected to a metallization in a housing or directly to one of the first and second filters by a plurality of vias such that an inductance of the ground connection is less than an inductance if the ground connection was made by a single via;
    wherein each terminal surface of the first and the second filter connections is connected to the corresponding first and second filter by exactly one single via;
    wherein each terminal surface of the common signal connection is connected to the first and the second filters using a plurality of partial vias, wherein each of the plurality of partial vias penetrates through only a part of the substrate comprising multiple dielectric layers, wherein the plurality of partial vias are connected to each other by a transverse segment disposed within a metallization plane between adjacent ones of the multiple dielectric layers of the substrate; and
    wherein at least one of the first and the second filters is electrically connected to the substrate via flip chip bonding.

2. The component according to claim 1, wherein all of the at least seven terminal surfaces comprise an arrangement of at least 3×3 terminal surfaces on the substrate bottom.

3. The component according to claim 1, wherein at least one of the signal or first and second filter connections comprises the pair of terminal surfaces balanced to each other with respect to ground, and wherein the pair of terminal surfaces are disposed directly adjacent to each other at one of the edges of the substrate.

4. The component according to claim 1, wherein all of the terminal surfaces of the common signal and filter connections are disposed along one of the substrate edges, wherein one of the plurality of ground terminal surfaces is disposed between terminal surfaces of the common signal connection, the first filter connection, and the second filter connection.

5. The component according to claim 1, wherein the ones of the at least seven terminal surfaces disposed near the substrate edges enclose one or more of the plurality of ground terminal surfaces disposed closer to a central area of the substrate bottom than the ones of the at least seven terminal surfaces disposed near the substrate edges.

6. The component according to claim 1, wherein at least one of the plurality of ground terminal surfaces has a greater area than the individual terminal surface of the common signal connection, the first filter connection, or the second filter connection.

7. The component according to claim 1, wherein the common signal connection is disposed centered on one of the substrate edges.

8. The component according to claim 1, wherein the common signal connection is connected to an antenna connection, wherein the first and second filter connections are formed as filter input and/or output, and wherein the component implements a diplexer or a duplexer.

9. The component according to claim 1, wherein the first filter or the second filter comprises an LC element disposed in the substrate.

10. The component according to claim 1,
    wherein at least one filter connection comprises a pair of terminal surfaces balanced to each other with respect to ground, that are at different distances from the signal connection and are disposed on the substrate bottom,
    wherein the terminal surface of the pair that is disposed closer to the signal connection comprises a smaller surface area than the respectively other terminal surface of the pair.

11. The component according to claim 1, wherein at least two of the plurality of ground terminal surfaces on the substrate bottom are electrically connected to each other.

12. The component according to claim 1, wherein each of the first and second filter connections connected to the single via is routed directly adjacent to one of the plurality of vias connected to one of the plurality of ground terminal surfaces, wherein a distance between the single via of one of the first and second filter connections and the directly adjacent one of the plurality of vias connected to the one of the plurality of ground terminal surfaces is relatively less than a distance between the single via of the first filter connection and the single via of the second filter connection.

13. The component according to claim 1, wherein the terminal surfaces of the first and second filter connections are disposed at opposite ones of the edges of the substrate, while the individual or the pair of terminal surfaces assigned to the common signal connection are disposed at a third one of the substrate edges.

14. The component according to claim 1, wherein two or three of the common signal connection and the first and the second filter connections balanced to each other with respect to ground are provided.

15. The component according to claim 1, wherein the first filter is mounted on the substrate and the second filter is also mounted on the substrate.

16. The component according to claim 15, wherein the first filter and the second filter comprise separate discrete components on a top surface of the substrate.

17. The component according to claim 15, wherein the first filter and the second filter comprise two filters on a common piezoelectrical filter substrate that is mounted on the substrate.

18. The component according to claim 1, wherein the first filter is mounted on the substrate and the second filter is implemented in the substrate.

19. The component according to claim 1, wherein the first filter is implemented in the substrate and the second filter is also implemented in the substrate.

20. The component according to claim 1, wherein a surface area of the plurality of ground terminal surfaces is greater than a surface area of the terminal surfaces of the common signal connection and the terminal surfaces of the first and second filter connections.

21. The component according to claim 1, wherein at least one of the plurality of ground terminal surfaces is provided in a central area of the bottom surface, the central area being enclosed by an edge area comprising all the terminal surfaces of the common signal connection and all the terminal surfaces of the first and second filter connections.

22. The component according to claim 1, wherein each ground terminal surface is connected directly to said one of the first and second filters by the plurality of vias.

23. The component according to claim 1, wherein for each of the first filter connection and the second filter connection, said one single connected to the respective first or second filter connection is routed directly adjacent to a via connected to one of said ground connections of the same filter, wherein one single the via connected to the respective first or second filter connection is closer to the via connected to one of said ground connections of the same filter than to another via of the component.

24. The component according to claim 1, wherein the metallization plane further comprises a structured metallization configured to implement a circuit is disposed in every two of said multiple dielectric layers.

25. The component according to claim 1, further comprising a capacitor and an inductor disposed in the substrate.

26. An electrical component comprising:
a substrate having a rectangular bottom surface;
a first filter implemented in or mounted on the substrate;
a second filter implemented in or mounted on the substrate;
a common signal connection, both the first and second filters being connected in parallel to the common signal connection;
a first filter connection at the first filter;
a second filter connection at the second filter, wherein the common signal connection and the first and second filter connections are disposed on the bottom surface of the substrate and are each assigned an individual terminal surface carrying a signal, or a pair of terminal surfaces balanced to each other with respect to ground, thereby implementing respective component connections;
a plurality of ground terminal surfaces disposed on the bottom surface of the substrate;
a first and a second via that are both connected to the first filter connection; and
a third via routed to one ground surface terminal of the plurality of ground terminal surfaces;
wherein each terminal surface of the common signal connection is connected to the first and the second filters using a plurality of partial vias, wherein each of the plurality of partial vias penetrates through only a part of the substrate comprising multiple dielectric layers, wherein the plurality of partial vias are connected to each other by a transverse segment disposed within a metallization plane between adjacent ones of said multiple dielectric layers of the substrate;
wherein altogether at least seven terminal surfaces are disposed near edges of the substrate with a small space between the at least seven terminal surfaces and the edges of the substrate, the at least seven terminals surfaces including at least the plurality of ground terminal surfaces and the individual terminal surfaces or pairs of terminal surfaces;
wherein at least one of the plurality of ground terminal surfaces is disposed in a corner of the substrate bottom and is further away from at least one of the terminal surfaces of the common signal connection than one of the terminal surfaces of the first and second filter connections; and
wherein the first via and the third via are routed directly adjacent to each other so that a distance between the first via and the second via is less than a distance between the second via and the third via;
wherein at least one of the first and the second filters is electrically connected to the substrate via flip chip bonding.

27. The electrical component according to claim 26, wherein at least one of said signal or the first and the second filter connections comprises the pair of terminal surfaces balanced to each other with respect to ground, and wherein each pair of terminal surfaces are disposed directly adjacent to each other at one of the edges of the substrate;
wherein the at least seven terminal surfaces disposed near the edges of the substrate enclose one or more of the plurality of ground terminal surfaces disposed closer to a central area of the substrate bottom than the ones of the at least seven terminal surfaces disposed near the substrate edges;

wherein at least one of the plurality of ground terminal surfaces has a greater area than one of the terminal surfaces of the signal or the first and second filter connections;

wherein the signal connection is disposed centered on one of the substrate edges; and wherein the signal connection is connected to an antenna connection, wherein the first and second filter connections are formed as filter input and/or output, and wherein the component implements a diplexer or a duplexer.

28. An electrical component comprising:
a substrate having a rectangular bottom surface;
a first filter implemented in or mounted on the substrate;
a second filter implemented in or mounted on the substrate;
a common signal connection, both the first and second filters being connected in parallel to the common signal connection;
a first filter connection at the first filter;
a second filter connection at the second filter, wherein the common signal connection and the first and second filter connections are disposed on the bottom surface of the substrate and are each assigned an individual terminal surface carrying a signal, or a pair of terminal surfaces balanced to each other with respect to ground, thereby implementing respective component connections;
a plurality of ground terminal surfaces disposed on the bottom surface of the substrate;
wherein altogether at least seven terminal surfaces are disposed near edges of the substrate, the at least seven terminals surfaces including at least the plurality of ground terminal surfaces and the individual terminal surfaces or the pairs of terminal surfaces;

wherein each terminal surface of the common signal connection is connected to the first and the second filters using a plurality of partial vias, wherein each of the plurality of partial vias penetrates through only a part of the substrate comprising multiple dielectric layers, wherein the plurality of partial vias are connected to each other by a transverse segment disposed within a metallization plane between adjacent ones of the multiple dielectric layers of the substrate;

wherein at least one of the plurality of ground terminal surfaces is disposed in a corner of the bottom surface of the substrate and is further away from at least one of the terminal surfaces of the common signal connection than one of the terminal surfaces of the first and second filter connections.

29. The electrical component of claim 28, further comprising:
a first and a second via that are both connected to the first filter connection; and
a third via routed to one of the plurality of ground terminal surfaces, wherein the first via and the third via are routed directly adjacent to each other so that a distance between the first via and the second via is less than a distance between the second via and the third via.

30. The electrical component of claim 28, wherein at least filter of the first and the second filters is electrically connected to the substrate via flip chip bonding.

31. The electrical component of claim 28, wherein the at least seven terminal surfaces at the bottom surface of the substrate are spaced away from the edges of the substrate by a small space between the at least seven terminal surfaces and the edges of the substrate.

* * * * *